United States Patent
Hsu et al.

(10) Patent No.: US 7,402,067 B2
(45) Date of Patent: Jul. 22, 2008

(54) IC SOCKET WITH LEVER

(75) Inventors: Hsiu-Yuan Hsu, Tu-Cheng (TW);
Chun-Fu Lin, Tu-Cheng (TW)

(73) Assignee: Hon Hai Precision Ind. Co., Ltd.,
Taipei Hsien (TW)

( * ) Notice: Subject to any disclaimer, the term of this patent is extended or adjusted under 35 U.S.C. 154(b) by 0 days.

(21) Appl. No.: 11/810,249

(22) Filed: Jun. 5, 2007

(65) Prior Publication Data

US 2007/0281529 A1    Dec. 6, 2007

(30) Foreign Application Priority Data

Jun. 5, 2006    (TW) ............... 95209717 U

(51) Int. Cl.
*H01R 4/50* (2006.01)

(52) U.S. Cl. ....................... 439/342; 439/331

(58) Field of Classification Search ............ 439/73, 439/331, 342

See application file for complete search history.

(56) References Cited

U.S. PATENT DOCUMENTS

| | | | |
|---|---|---|---|
| 6,371,785 B1 * | 4/2002 | Howell et al. ............... | 439/342 |
| 6,406,317 B1 * | 6/2002 | Li et al. ...................... | 439/342 |
| 6,638,093 B1 * | 10/2003 | Chang ......................... | 439/342 |
| 6,893,283 B2 * | 5/2005 | Yu ............................... | 439/342 |

* cited by examiner

*Primary Examiner*—Thanh-Tam T Le
(74) *Attorney, Agent, or Firm*—Wei Te Chung

(57) ABSTRACT

An IC socket (2) includes a base (21), a cover (22) engaged upon the base and moveable along a front-to-back direction relative to the base, and a lever (23) for driving the cover to slide on the base. The lever includes a lateral rod (232) and a longitudinal rod (231) connected to the lateral rod, with the lateral rod defining an engagement section (233) adapted to engage the cover for urging the cover to move. The engagement section has a body of flexible material (234) thereon for preventing abrasion of a part of the cover associated with the engagement section and for eliminating damage caused by engagement abrasion.

7 Claims, 5 Drawing Sheets

IC SOCKET WITH LEVER

BACKGROUND OF THE INVENTION

1. Field of the Invention

The present invention relates to the art of electrical connectors, and more particularly to a lever for use in an IC socket.

2. Description of the Related Art

One conventional IC socket 8 is shown in FIG. 5. The IC socket 8 comprises a base 80, a cover 81 engaged upon the base 80 and moveable along a front-to-back direction relative to the base 80, and a lever 82 for driving the cover 81 to slide on the base 80. The lever 82 includes a lateral rod 820 and a longitudinal rod 821 attached to the lateral rod 820, with application of the longitudinal rod 821 for ease of the user to handle the lever 82 of the IC socket 8. The lateral rod 820 of the lever 82 defines an engagement section 822 adapted to engage the cover 81 for urging the cover 80 to move. Since the lever 82 is typically made of a metal material, and the cover 81 is typically made of an insulative material, repeated engagement of the metal lever 82 against the insulative cover 81 will result in the abrasion of the cover 81, and even do damage to the cover 81 or the IC socket 8. Therefore, there is a need to provide a new IC socket to resolve the above-mentioned shortcomings.

SUMMARY OF THE INVENTION

An IC socket according to an embodiment of the present invention includes a base, a cover engaged upon the base and moveable along a front-to-back direction relative to the base, and a lever for driving the cover to slide on the base. The lever includes a lateral rod and a longitudinal rod connected to the lateral rod, with the lateral rod defining an engagement section adapted to engage the cover for urging the cover to move. The engagement section has a body of flexible material thereon for preventing abrasion of a part of the cover associated with the engagement section and for eliminating damage caused by engagement abrasion.

Other features and advantages of the present invention will become more apparent to those skilled in the art upon examination of the following drawings and detailed description of preferred embodiments, in which:

DETAILED DESCRIPTION OF PREFERRED EMBODIMENT

Figure 1:
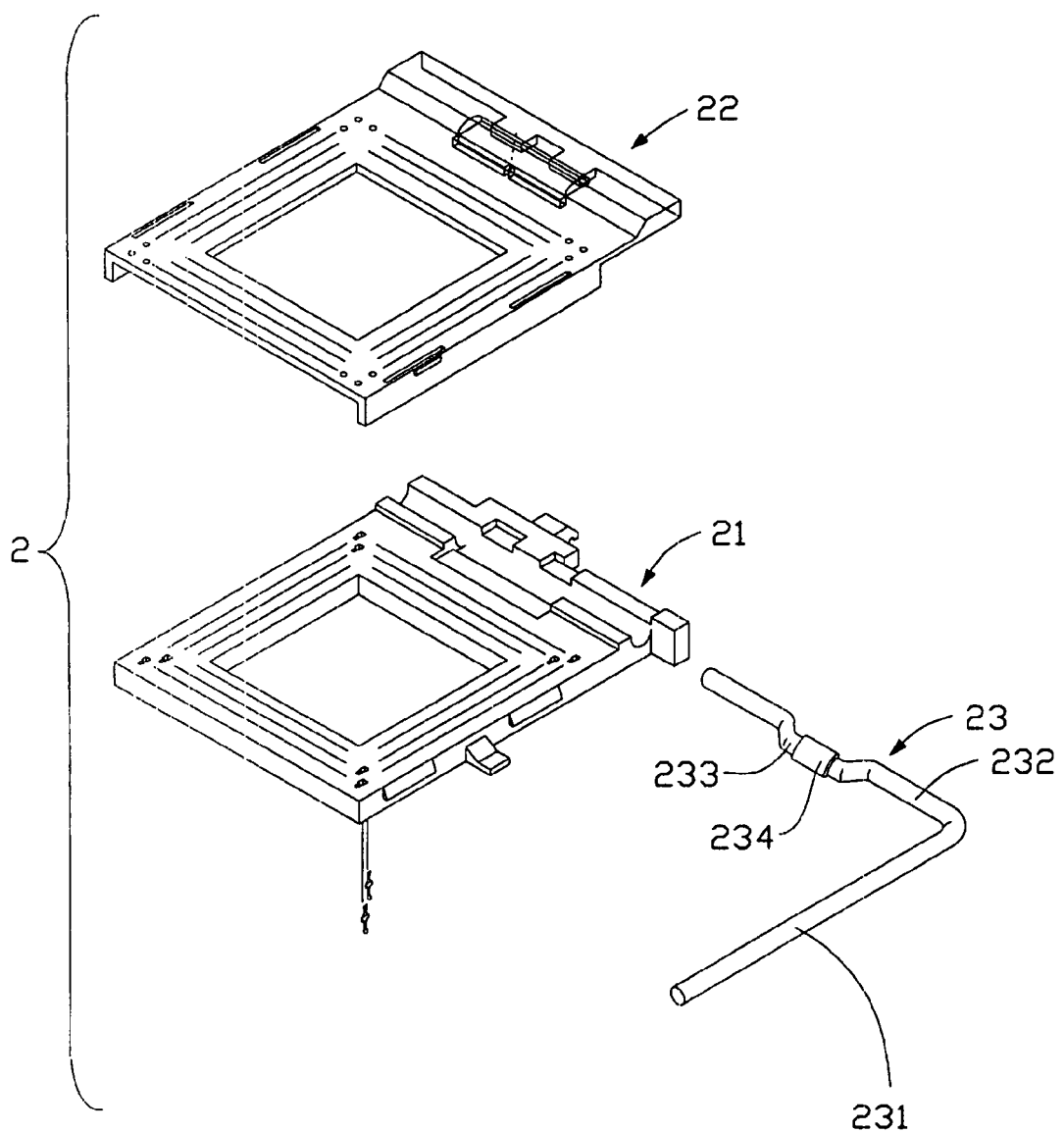
FIG. 1 is an exploded, perspective view of an IC socket according to an embodiment of the present invention.
Figure 2:
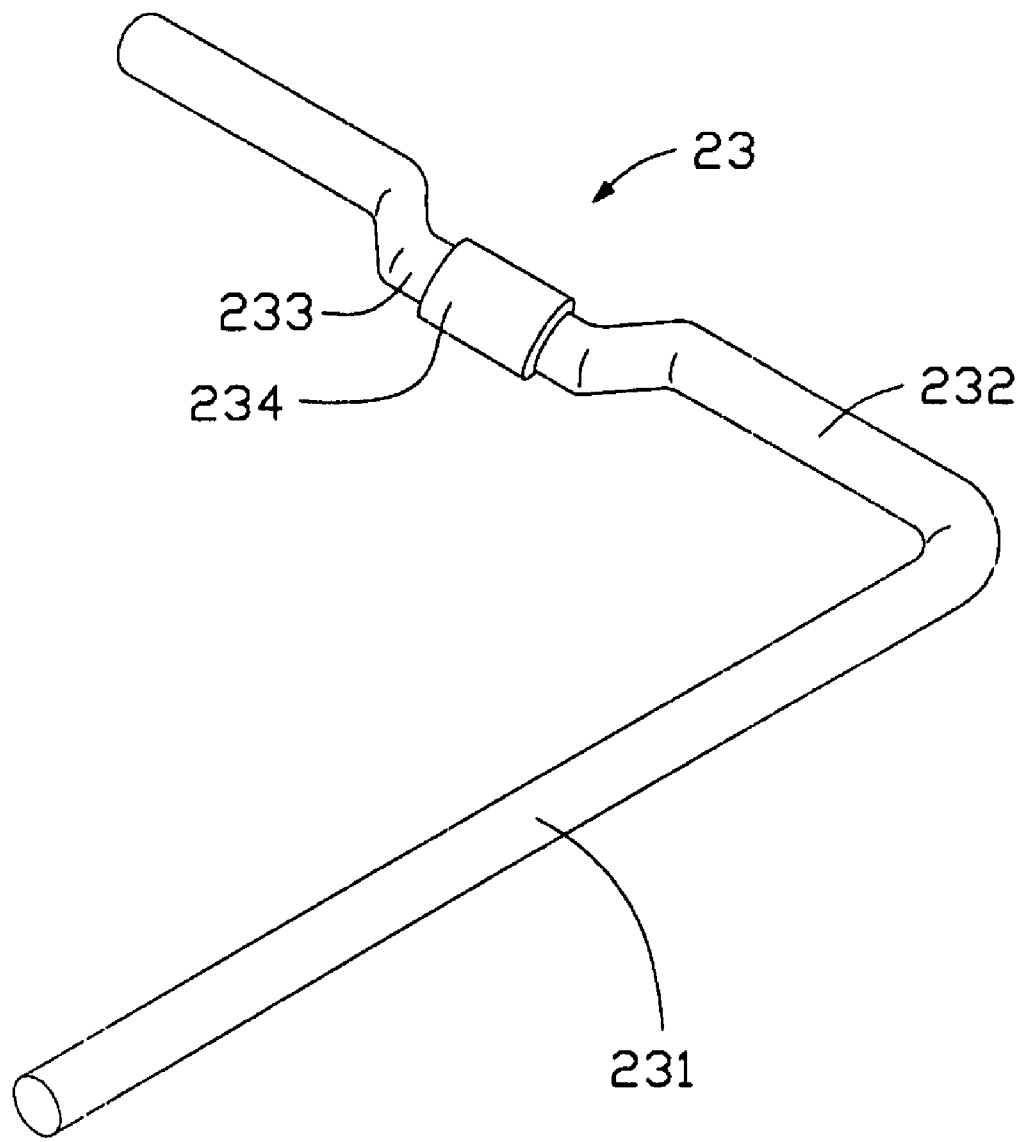
FIG. 2 is an enlarged view of a lever of FIG. 1.
Figure 3:
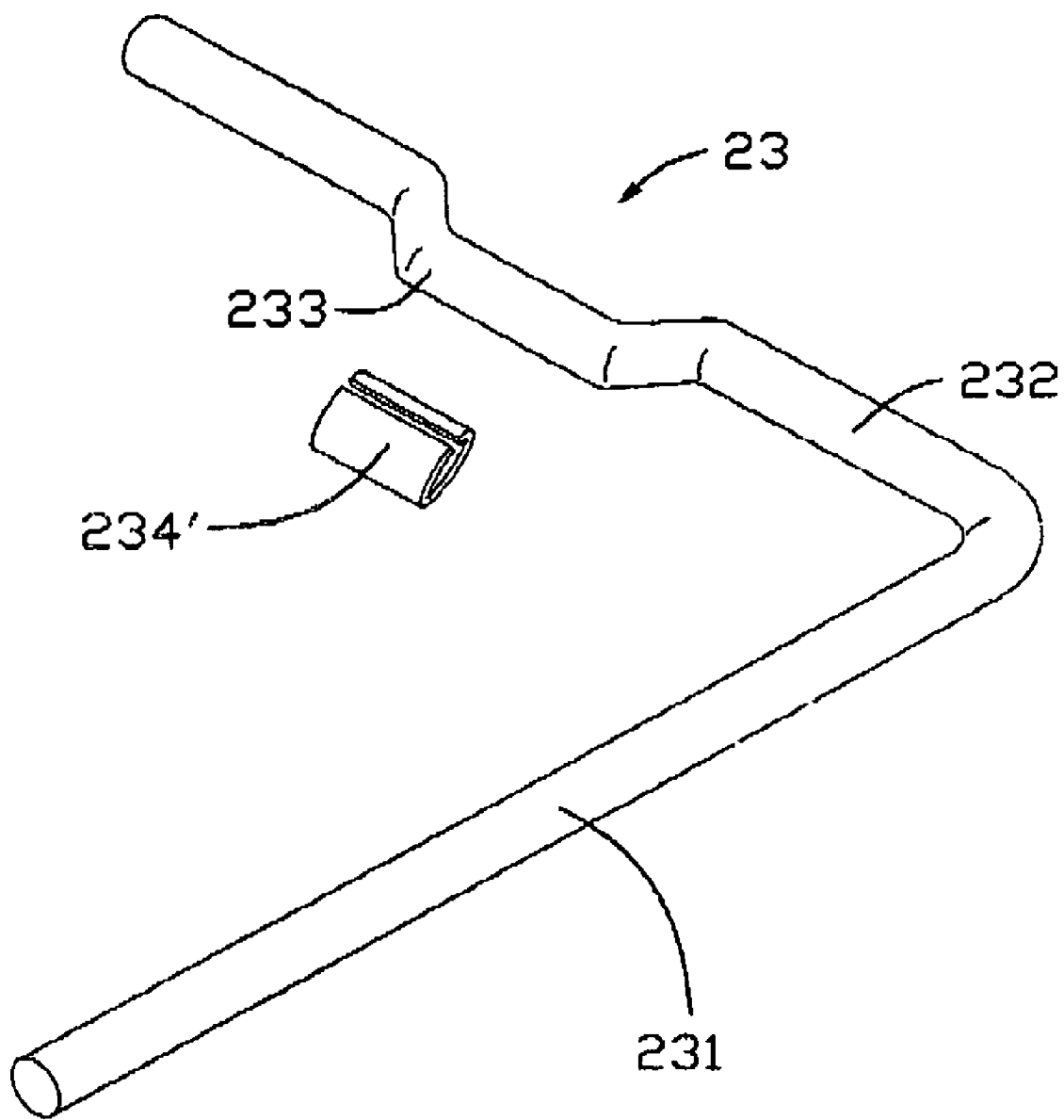
FIG. 3 is a view showing a body of flexible material formed as a layer to be ready to adhere to an engagement section of the lever.
Figure 4:
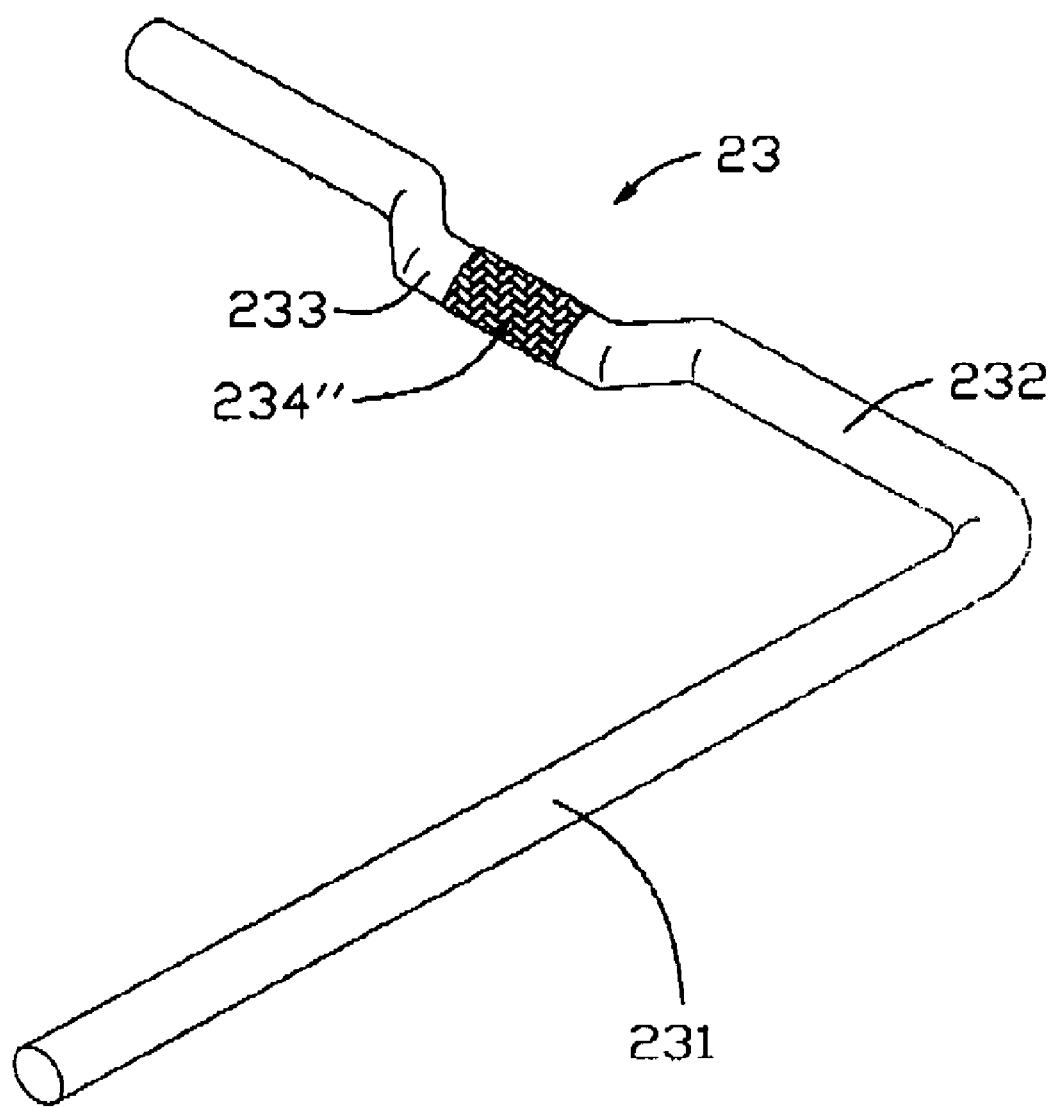
FIG. 4 is a view showing a body of flexible material formed as a layer to be coated on an engagement section of the lever.
Figure 5:
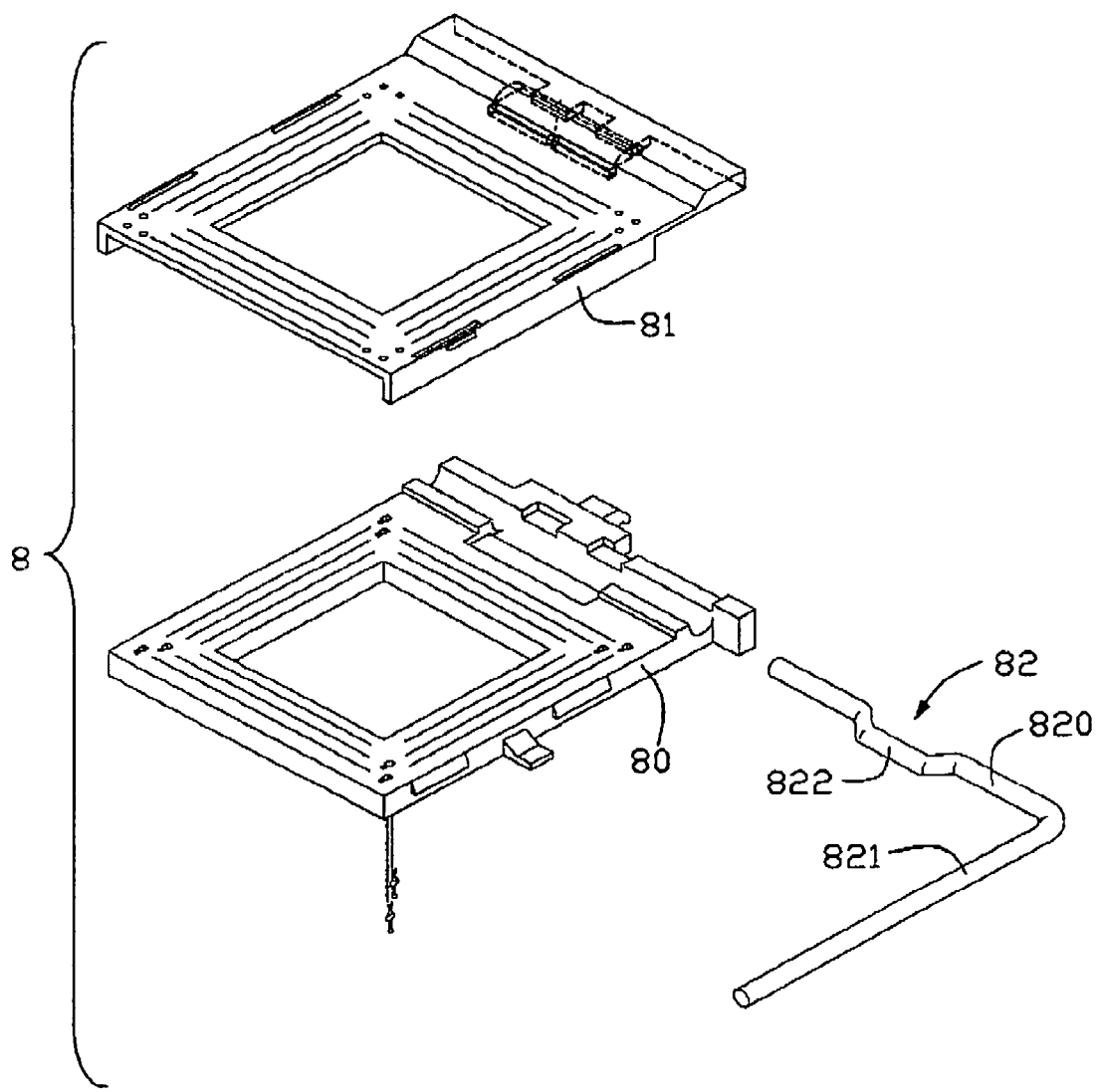
FIG. 5 is an exploded, perspective view of a conventional IC socket.

Referring to FIGS. 1-4, an IC socket 2 according to an embodiment of the present invention comprises a base 21, a cover 22 engaged upon the base 21 and moveable along a front-to-back direction relative to the base 21, and a lever 23 for driving the cover 22 to slide on the base 21. The cover 22 is generally made of an insulative material. The lever 23 is generally made of a metal material, and includes a lateral rod 232 and a longitudinal rod 231 connected to the lateral rod 232, with the longitudinal rod 231 set for the user to handle the lever 23. The lateral rod 232 of the lever 23 defines an engagement section 233 adapted to engage the cover 22 for urging the cover 22 to move. The engagement section 233 has a body of flexible material thereon for preventing abrasion of a part of the cover 22 associated with the engagement section 233 of the lever 23 and for eliminating damage caused by engagement abrasion. The flexible material is defined as any material, which is required to be much softer than the material of the cover so as to prevent abrasion of that part of the cover and eliminate damage caused by engagement abrasion. For example, the flexible material is of rubber polymer 234. In this embodiment as shown in FIG. 3, the body of flexible Material is formed as a layer 234' to adhere to the engagement section 233 of the lever 23. In an alternative embodiment as shown in FIG. 4 the body of flexible material may. be formed as a layer 234" to be coated on the engagement section 233 of the lever. In another embodiment, according to special manufacturing process, the engagement section 233 of the lever 23 may have a pan made of flexible material while having the remainder of the engagement section still made of metal material, wherein that flexible part is the surface part adapted for engaging the cover 22. Thus, the introduce of the body of the flexible material on the engagement section 233 will have the function of preventing abrasion of the cover 22 against the lever 23 and eliminating damage caused by engagement abrasion.

While the present invention has been described with reference to preferred embodiments, the description of the invention is illustrative and is not to be construed as limiting the invention. Various of modifications to the present invention can be made to preferred embodiments by those skilled in the art without departing from the true spirit and scope of the invention as defined by the appended claims.

What is claimed is:

1. An IC socket comprising:
   a base;
   a cover engaged upon the base and moveable along a front-to-back direction relative to the base; and
   a lever for driving the cover to slide on the base, the lever including a lateral rod and a longitudinal rod connected to the lateral rod;
   said lateral rod defining an engagement section disposed in an offset relationship with the lateral rod, the engagement section adapted to engage the cover for urging the cover to move;
   the engagement section having a body of flexible material thereon for preventing abrasion of a part of the cover associated with the engagement section and for eliminating damage caused by engagement abrasion;
   the body of the flexible material is essentially fully surrounds the engagement section while only an upper part of the body of the flexible material radially engages an interior face of the cover;
   the body of flexible material is formed as a part of the engagement section; and
   another part of the engagement section is made of a metal.

2. The IC socket as recited in claim 1, wherein the body of flexible material is formed as a layer to be coated on the engagement section of the lever.

3. The IC socket as recited in claim 1, wherein the lever is made of a metal material.

4. The IC socket as recited in claim 3, wherein the cover is made of an insulative material.

5. An IC socket comprising:

a base;

a cover engaged upon the base and moveable along a front-to-back direction relative to the base; and a lever for driving the cover to slide on the base, the lever including a lateral rod and a longitudinal rod connected to the lateral rod;

said lateral rod defining an engagement section disposed in an offset relationship with the lateral rod, the engagement section engaging a corresponding section of the cover for urging the cover to move; and at least one of the engagement section and said corresponding section having a body of flexible material thereon for avoiding rigid radial engagement between the engagement section and the corresponding section;

the body of the flexible material is essentially fully surrounds the engagement section while only an upper part of the body of the flexible material radially engages an interior face of the cover;

the body of flexible material is formed as a part of the engagement section; and another part of the engagement section is made of a metal.

6. The IC socket as recited in claim 5, wherein the body of flexible material is formed as a layer to be coated on the engagement section of the lever.

7. The IC socket as recited in claim 5, wherein the cover is made of an insulative material while the lever is made of metal.

* * * * *